United States Patent
Mann et al.

(10) Patent No.: US 9,414,528 B2
(45) Date of Patent: Aug. 9, 2016

(54) THERMAL SPREADING FOR AN EXTERNALLY PLUGGABLE ELECTRONIC MODULE

(71) Applicant: International Business Machines Corporation, Armonk, NY (US)

(72) Inventors: Phillip V. Mann, Rochester, MN (US); Kevin M. O'Connell, Rochester, MN (US); Arvind K. Sinha, Rochester, MN (US); Karl Stathakis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 14/549,653

(22) Filed: Nov. 21, 2014

(65) Prior Publication Data

US 2016/0135327 A1    May 12, 2016

Related U.S. Application Data

(63) Continuation of application No. 14/534,273, filed on Nov. 6, 2014.

(51) Int. Cl.
*H05K 7/20*    (2006.01)

(52) U.S. Cl.
CPC .......... *H05K 7/20418* (2013.01); *H05K 7/2039* (2013.01)

(58) Field of Classification Search
CPC .................................................. H05K 7/20418
USPC .......... 361/679.46–679.54, 688–723; 385/92; 174/15.6; 439/485
See application file for complete search history.

(56) References Cited

U.S. PATENT DOCUMENTS

| 5,794,454 A | 8/1998 | Harris et al. |
| 5,898,569 A | 4/1999 | Bhatia |
| 6,341,062 B1 | 1/2002 | Patel |

(Continued)

FOREIGN PATENT DOCUMENTS

JP    2005159346 A    6/2005

OTHER PUBLICATIONS

U.S. Appl. No. 14/534,273, filed Nov. 6, 2014.

(Continued)

*Primary Examiner* — Zachary M Pape
(74) *Attorney, Agent, or Firm* — Robert Williams; Nicholas D. Bowman

(57) ABSTRACT

A cooling apparatus for dissipating heat from an electronic module is disclosed. The cooling apparatus may include a thermally conductive shell having a surface in contact with, and configured to conduct heat away from, the module. The apparatus may also include an electrically insulative layer positioned between, and configured to conduct heat from, the module to the shell. The apparatus may also include an electrical cord, attached to the module that contains a thermally conductive layer in thermally conductive contact with the shell that is configured to conduct heat away from the shell. The apparatus may also include an electrically insulative layer between the thermally conductive layer and an electrical conductor within the electrical cord. The apparatus may also include an electrically insulative layer, positioned between the thermally conductive layer and an electrical cord outer surface, configured to convectively dissipate heat from the thermally conductive layer.

7 Claims, 3 Drawing Sheets

(56) References Cited

U.S. PATENT DOCUMENTS

| | | | |
|---|---|---|---|
| 6,452,093 B1* | 9/2002 | Ishii | G06F 1/163 174/16.3 |
| 6,566,164 B1 | 5/2003 | Glenn et al. | |
| 7,475,175 B2 | 1/2009 | Klein et al. | |
| 7,649,138 B2 | 1/2010 | Hiller et al. | |
| 7,765,811 B2 | 8/2010 | Hershberger et al. | |
| 7,885,076 B2 | 2/2011 | Sharifipour et al. | |
| 9,022,800 B2 | 5/2015 | Yang et al. | |
| 2003/0066637 A1 | 4/2003 | Zimman | |
| 2003/0122457 A1 | 7/2003 | Diaz et al. | |
| 2005/0167083 A1 | 8/2005 | Belady et al. | |
| 2006/0198103 A1 | 9/2006 | Ammirata | |
| 2008/0044143 A1 | 2/2008 | Wang et al. | |
| 2010/0303424 A1 | 12/2010 | Furuyama | |
| 2011/0211351 A1* | 9/2011 | Van De Ven | F21K 9/17 362/249.02 |
| 2011/0317964 A1 | 12/2011 | Downs | |
| 2012/0175146 A1 | 7/2012 | Oka et al. | |
| 2012/0280580 A1 | 11/2012 | Tso et al. | |
| 2015/0118880 A1 | 4/2015 | Murphy et al. | |

OTHER PUBLICATIONS

Mann et al., "Thermal Spreading for an Externally Pluggable Electronic Module," U.S. Appl. No. 14/534,273, filed Nov. 6, 2014.
List of IBM Patents or Patent Applications Treated As Related.

* cited by examiner

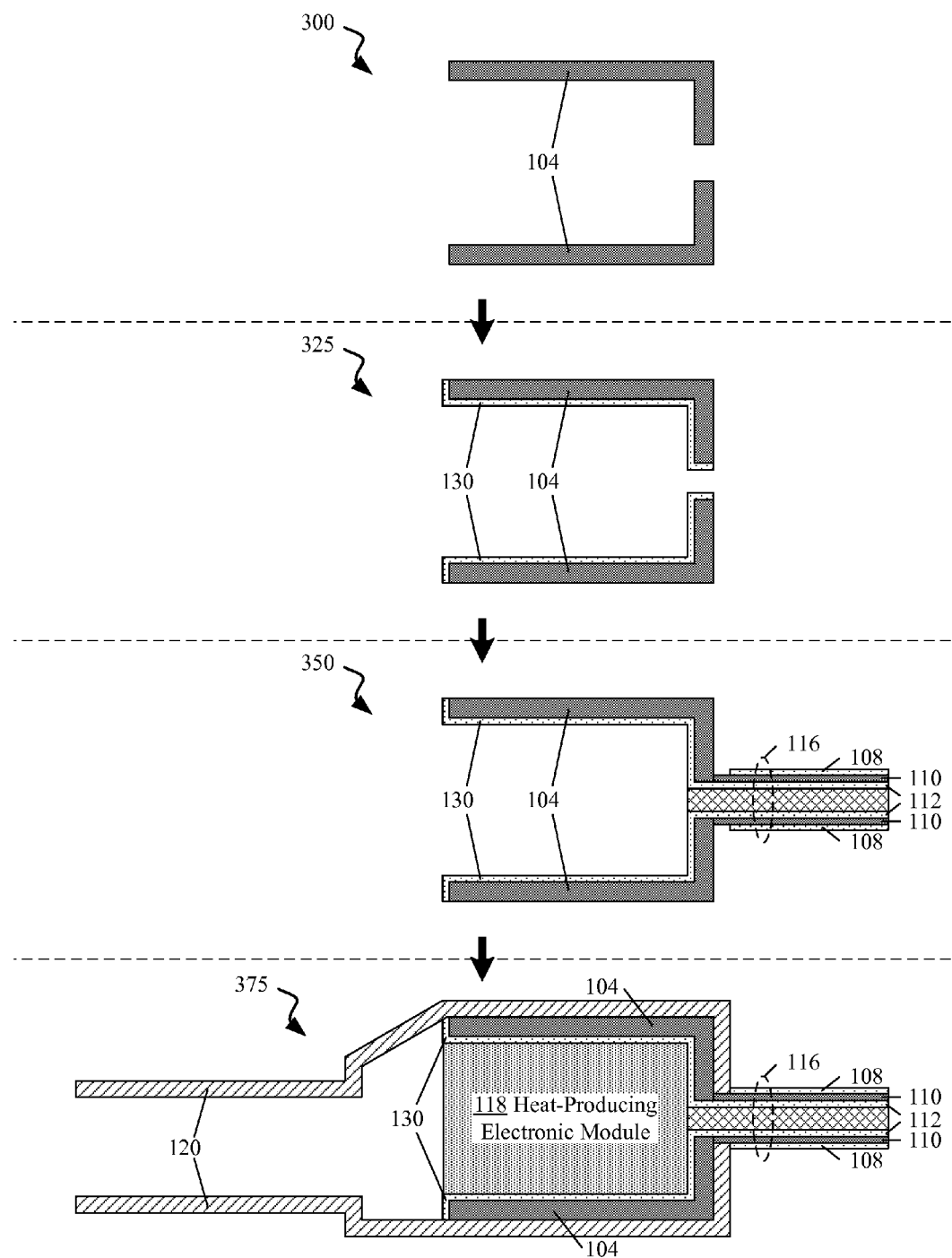
FIG. 3  Assembling a Cooling Apparatus

THERMAL SPREADING FOR AN EXTERNALLY PLUGGABLE ELECTRONIC MODULE

BACKGROUND

The present disclosure generally relates to cooling a heat-producing electronic module. In particular, this disclosure relates to thermal spreading of heat to an electrical cord attached to an externally pluggable heat-producing electronic module.

A heat sink may be used in computers and electronic systems as a passive heat exchanger, and may act as a reservoir that can absorb an arbitrary amount of heat without significantly changing temperature. Heat sinks may be used in computers, for example, to cool devices such as central processing units (CPUs) and/or graphics processing units (GPUs).

A heat sink may also dissipate heat produced by electronic devices into a medium, such as air, water, or a coolant/refrigerant. Heat sinks may reach a temperature greater than a cooling medium, in order to transfer heat across a thermal gradient from an electronic device to the medium, by convection, radiation, or conduction.

A thermal interface material (TIM) may be used to enhance heat transfer between an electronic device, such as an integrated circuit (IC), and a heat sink, and may be fabricated from thermally conductive material. A TIM may increase thermal conductivity by filling irregularities and air gaps between adjacent, mating surfaces (e.g., of the IC and the heat sink) with a thermally conductive material.

SUMMARY

Various aspects of the present disclosure may be useful for improving heat spreading and dissipation for an externally pluggable heat-producing electronic module. A heat-producing electronic module configured according to embodiments of the present disclosure may have enhanced reliability, as a result of lower operating temperatures, relative to a module without improved heat spreading capability.

Embodiments may be directed towards a cooling apparatus for dissipating heat from a heat-producing electronic module. The cooling apparatus may include a thermally conductive shell having at least one surface in thermally conductive contact with the heat-producing electronic module, and configured to conduct heat away from the heat-producing electronic module. The cooling apparatus may also include a first electrically insulative layer, positioned between the at least one surface of the thermally conductive shell and the heat-producing electronic module and configured to conduct heat from the heat-producing electronic module to the thermally conductive shell. The cooling apparatus may also include an electrical cord attached to the heat-producing electronic module and containing a thermally conductive layer in thermally conductive contact with the thermally conductive shell, the thermally conductive layer configured to conduct heat away from the thermally conductive shell. The cooling apparatus may also include a second electrically insulative layer, positioned between the thermally conductive layer and at least one electrical conductor within the electrical cord and a third electrically insulative layer, positioned between the thermally conductive layer and an outer surface of the electrical cord, and configured to convectively dissipate heat from the thermally conductive layer.

Embodiments may also be directed towards a system for dissipating heat from a heat-producing electronic module. The system may include a chassis having at least one receptacle configured to receive a heat-producing electronic module, a heat-producing electronic module inserted into a receptacle of the at least one receptacle and a cooling apparatus configured to dissipate heat from the heat-producing electronic module. The cooling apparatus may include a thermally conductive shell in thermally conductive contact with the heat-producing electronic module, and configured to conduct heat away from the heat-producing electronic module. The cooling apparatus may also include a first electrically insulative layer, positioned between the at least one surface of the thermally conductive shell and the heat-producing electronic module and configured to conduct heat from the heat-producing electronic module to the thermally conductive shell. The cooling apparatus may also include a first thermally conductive electrical cord attached to the heat-producing electronic module and containing a thermally conductive layer in thermally conductive contact with the thermally conductive shell, the thermally conductive layer configured to conduct heat away from the thermally conductive shell. The cooling apparatus may also include a second electrically insulative layer, positioned between the thermally conductive layer and at least one electrical conductor within the first thermally conductive electrical cord and a third electrically insulative layer, positioned between the thermally conductive layer and an outer surface of the first thermally conductive electrical cord, and configured to convectively dissipate heat from the thermally conductive layer. The system may also include a fan operable to dissipate heat from the thermally conductive layer of the cooling apparatus by flowing cooling air across the first thermally conductive electrical cord attached to the heat-producing electronic module.

Embodiments may also be directed towards a method for assembling a cooling apparatus for dissipating heat from a heat-producing electronic module. The method may include attaching an electrically insulative layer to at least one interior surface of a thermally conductive shell and attaching a thermally conductive layer of a thermally conductive electrical cord to the thermally conductive shell. The method may also include inserting, to form a thermally conductive interface between an outer surface of the heat-producing electronic module and an interior surface of the thermally conductive shell, the heat-producing electronic module into the thermally conductive shell.

Aspects of the various embodiments may be used to enable enhanced performance and/or power dissipation of pluggable electronic modules. Aspects of embodiments may also be useful for lowering the operating temperature of an electronic system chassis, and providing increased electromagnetic interference (EMI) shielding within an electrical cord connected to an externally pluggable electronic module. Aspects of the various embodiments may also be useful for providing cost-effective cooling apparatuses for use with heat-producing electronic modules, by using existing and proven design, fabrication, assembly and thermal interface material (TIM) technologies.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 3 includes four cross-sectional drawings depicting a sequence of steps for assembling an apparatus for cooling an externally pluggable heat-producing electronic module, according to embodiments consistent with FIGS. 1, 2.

Figure 1:
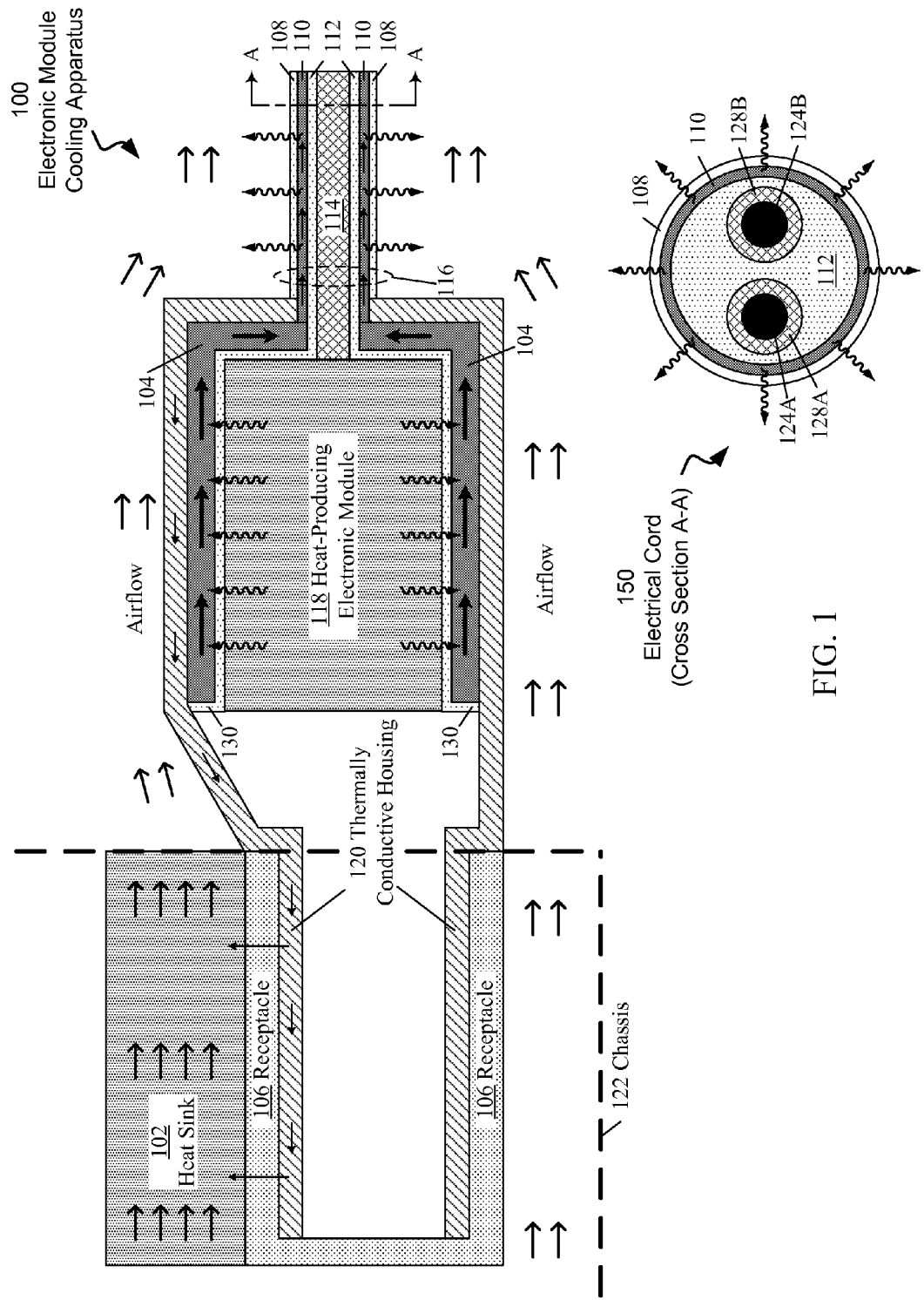
FIG. 1 is a cross-sectional drawing depicting an apparatus for cooling an externally pluggable heat-producing electronic module, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing thermal spreading for cooling externally pluggable electronic modules such as optoelectronic interface devices or modules. Optoelectronic modules may be used to reversibly convert between electrical and optical modes of signal transmission, and may be useful to enable optical data transmission, for example, between computers and/or data communication networks. While not necessarily limited thereto, embodiments discussed in this context can facilitate an understanding of various aspects of the disclosure. Certain embodiments may also be directed towards other equipment and associated applications, such as providing thermal spreading for cooling charging cables for portable devices. Device charging cables may contain active (heat-producing) electronics, and may be useful for charging a wide variety of portable electronic devices such as cell phones, personal digital assistants (PDAs), laptops and pagers.

Embodiments may also be directed towards providing thermal spreading for cooling cable assemblies including signal boosters and re-drive devices. Such cable assemblies may contain active electronic (heat-producing) devices used to repower or drive signals over a longer cable length than would be practical for signals that were not actively re-driven.

For ease of discussion, it may be understood that the terms "electronic module", "heat-producing electronic module", "electronic device" and "heat-producing electronic device" may be used interchangeably herein, in reference to an electronic apparatus or assembly which may generate heat during its operation.

A heat-producing electronic module such as an optoelectronic module or other electronic module, device, or assembly that is externally pluggable into a chassis, may be cooled by flowing cooling air over the module to limit its operating temperature. Limiting a heat-producing electronic module's operating temperature to a specified range may allow it to operate stably and reliably for the duration of a specified operating life.

In certain applications, flowing cooling air over the heat-producing electronic module may not sufficiently limit the module's operating temperature within the specified operating range. A heat sink located within the chassis and thermally coupled to the heat-producing electronic module through a thermally conductive module housing may be used for the removal and dissipation of heat from the heat-producing module.

A thermally conductive path between the heat-producing electronic module and a heat sink may include a mating interface between the thermally conductive housing and a corresponding receptacle within the chassis. In certain applications, this mating interface may not include a thermal interface material (TIM). Each element in the thermally conductive path (e.g., the thermally conductive housing, receptacle, and mating interfaces) may offer thermal resistance to heat flowing from the heat-producing electronic module to the heat sink. Thermal resistance may, in turn, may limit heat removal from the heat-producing electronic module and may limit the maximum power and performance of the electronic module.

According to embodiments of the present disclosure, a cooling apparatus may include a thermally conductive shell in thermally conductive (physical) contact with a heat-producing electronic module. The thermally conductive shell may also be in thermally conductive contact with a thermally conductive layer of an electrical cord that is attached to the module. The cooling apparatus may be useful to conduct heat away from the heat-producing electronic module to the thermally conductive layer of the electrical cord, where it may be dissipated by cooling air flowing over the cord.

In certain embodiments, efficient heat transfer away from a heat-producing electronic module can be useful for providing a desired module operating temperature range and increased electronic device and system reliability. In embodiments, efficient heat removal from an electronic module may allow the module to dissipate an increased amount of heat, which may, for example, allow the module to be operated at a higher frequency and yield higher module and/or system performance, relative to a module having less efficient heat removal. For example, a heat-producing electronic module with inefficient heat removal may be able to dissipate approximately 2 Watts (W), while a heat-producing electronic module with efficient heat removal (increased heat spreading through the use of a thermally conductive shell) may be able to dissipate approximately 5 W.

A cooling apparatus according to embodiments may be configured to fit within the dimensions of, and be compatible with, an existing thermally conductive housing. A cooling apparatus according to embodiments may be a cost-effective, thermally efficient device for cooling externally pluggable electronic modules.

For the purpose of this application, materials referred to as "thermally conductive" which are also electrically conductive may generally have a thermal conductivity greater than 100 W/m*K. Such materials may include metals such as aluminum, copper, brass and nickel. Other materials, such as carbon fiber, graphite and graphene may have different ranges of thermal conductivities.

The following table lists, by way of example, some materials which may be useful in the construction of an electronic module cooling apparatus.

TABLE 1

Thermal Conductivity Values

| Material | Thermal conductivity (W/m*K range) |
| --- | --- |
| Aluminum | 204-250 |
| Copper | 350-401 |
| Carbon fiber (electrically insulative) | 21-180 |
| Graphite | 300-1500 |
| Graphene | 5020 (theoretical) |
| Electrically insulative plastic and polymer materials including: Nylon 66 Kapton tape Liquid Crystal Polymers (LCP) Acrylonitrile Butadiene Styrene (ABS) Polycarbonate-ABS (PC/ABS) Polyphenylene Sulfide (PPS) Crystalline Thermoplastics | .01-60 |

Certain embodiments relate to efficient transfer of heat away from a heat-producing electronic module to a thermally conductive electrical cord attached to the module. FIG. 1 is a cross-sectional drawing 100 depicting an apparatus for cooling an externally pluggable heat-producing electronic module 118, according to embodiments of the present disclosure. The apparatus may include a thermally conductive shell 104 in thermally conductive contact with the heat-producing electronic module 118 and in thermally conductive contact with a thermally conductive layer 110 of attached electrical cord 116.

The apparatus may be useful for conducting heat away from the heat-producing electronic module 118, through the thermally conductive shell 104 and into the thermally conductive layer 110 of attached electrical cord 116, where it may be dissipated. In certain embodiments, airflow in certain embodiments, airflow from chassis 122 is directed over, and enhances the heat dissipation from, electrical cord 116. In certain embodiments, the apparatus may include a single electrical cord 116 thermally coupled to the heat-producing electronic module 118. In certain embodiments, the apparatus may include two or more electrical cords 116 thermally coupled to the heat-producing electronic module 118.

In embodiments, thermally conductive shell 104 may have at least one interior surface in thermally conductive contact with, and may be useful to conduct heat away from, the heat-producing electronic module 118. In certain embodiments, thermally conductive shell 104 may be fabricated from aluminum or metal alloys containing aluminum, and in certain embodiments, thermally conductive shell 104 may be fabricated from copper or metal alloys containing copper.

A first electrically insulative layer 130 is depicted as positioned between at least one interior surface of the thermally conductive shell 104 and at least one surface of the heat-producing electronic module 118, and may be useful to conduct heat from the heat-producing electronic module 118 to the thermally conductive shell 104. First electrically insulative layer 130 can be useful for insulating heat-producing electronic module 118 from electrical hazards, such as electrostatic discharge (ESD) events, which may be introduced to electrical cord 116.

Electrically insulative layer 130 can include materials such as mica, Kapton tape, or a thermal interface material (TIM), or other electrically insulative materials listed in Table 1. Electrically insulative layer 130 may be self-adhesive, or attached to a surface of thermally conductive shell 104 through the use of commercially available adhesive products.

In certain embodiments, the heat-producing electronic module 118 may be an optoelectronic module, which may be useful for converting between electrical and optical modes of signal transmission. In certain embodiments, the optoelectronic module may be a "100 Gb/s form factor pluggable" (CXP) module. A CXP module may include electro-optical devices which may be sensitive to operating temperatures above approximately 50° C. In embodiments, an electronic module cooling apparatus may be useful for limiting and operating temperature for a heat-producing electronic module such as a CXP module.

In embodiments, an electrical cord 116 having a thermally conductive layer 110 may be attached to heat-producing electronic module 118. Thermally conductive layer 110 may be in thermally conductive contact with thermally conductive shell 104, and may be useful for conducting heat generated by heat-producing electronic module 118 away from thermally conductive shell 104, where it may be dissipated. In certain embodiments, thermally conductive layer 110 may include a layer of braided metal wires, for example, copper, nickel-plated copper, or aluminum wires. In certain embodiments, thermally conductive layer 110 may include a metallic foil, and in certain embodiments thermally conductive layer 110 may include a carbon fiber material. In embodiments having a thermally conductive layer 110 that is also electrically conductive (e.g., a layer of braided metal wires or metallic foil), layer 110 may be useful in providing electromagnetic interference (EMI) shielding for electrical conductors 124A, 124B (view 150). Such EMI shielding may both attenuate electrical emissions resulting from signals on electrical conductors 124A, 124B, and may also shield electrical conductors 124A, 124B from receiving electromagnetic interference from external sources, such as an adjacent cable or other radiating element.

Electrical cord core 114 (view 100) may include electrical conductors 124A, 124B (view 150) and insulative layers 128A, 128B (view 150). Electrical conductors 124A, 124B (view 150) of electrical cord 116 may be attached to heat-producing electronic module 118 and may be useful for electrically connecting electrically module 118, through electrical cord 116, to another electronic module, device, or system. In certain embodiments, electrical conductors 124A, 124B (view 150) may be configured to conduct power or "single-ended" signals, and in certain embodiments electrical conductors 124A, 124B may be configured in pairs to conduct differential signals. View 150 depicts two electrical conductors (124A, 124B), however embodiments may include a different number of electrical conductors suitable to provide electrical interconnect to heat-producing electronic module 118. In certain embodiments, insulative layers 128A, 128B (view 150) may surround electrical conductors 124A, 124B (view 150). In certain embodiments, electrical cord core 114 (view 100) may include one or more optical fibers which may be useful to conduct optical signals to or from a heat-producing electronic module 118.

In certain embodiments, a second electrically insulative layer 112 may be positioned between the at least one electrical conductor (e.g., 124A, 124B, view 150) and thermally conductive layer 110 within the electrical cord 116. Second electrically insulative layer 112 may abut first electrically insulative layer 130 to form a continuous electrically insulative layer from the thermally conductive shell 104 extending into the attached electrical cord 116. In certain embodiments that include an thermally and electrically conductive layer 110, second electrically insulative layer 112 may be useful for electrically insulating conductors 124A, 124B, (view 150) from layer 110.

In embodiments, a third electrically insulative layer 108 may be formed between the thermally conductive layer 110 and an outer surface of the electrical cord 116. Electrically insulative layer 108 can be a thermally conductive and relatively flexible material and may be useful for convectively dissipating heat transferred from the thermally conductive layer 110 to an outer surface of electrical cord 116. In embodiments, a thickness and surface contour or texture of electrically insulative layer 108 may be specified to promote heat dissipation from the outer surface of electrical cord 116. For example, a layer 108 thickness of 3 mm combined with ridges or grooves formed on the outer surface of layer 108 may increase the thermal dissipation capability of electrical cord 116, relative to an electrical cord having a thicker layer 108 having no surface irregularities. In certain embodiments having a thermally conductive layer 110 that is also electrically conductive, electrically insulative layer 108 may be useful for preventing electrical (e.g., ESD) events from being conducted through layer 110 to thermally conductive shell 104 and/or heat-producing electronic module 118. In certain embodiments having a thermally conductive layer 110 that is electrically insulative, third electrically insulative layer 108 may be optional.

In certain embodiments, an electronic module cooling apparatus may include a thermally conductive housing 120 that at least partially encloses and is in thermally conductive contact with the heat-producing electronic module 118. Thermally conductive housing 120 may be inserted into a receptacle 106 within chassis 122 and may provide a supplemental thermal path for transferring a portion of the heat generated by heat-producing electronic module 118 to a heat sink 102. Heat sink 102, located within electronic equipment chassis 122, may dissipate a portion of the heat generated by heat-producing electronic module 118. In embodiments, housing 120 may be constructed from sheet metal, or other thermally conductive material.

In certain embodiments, the combination of thermally conductive shell 104 and thermally conductive layer 110 may create a more efficient thermal path than the combination of thermally conductive housing 120 and receptacle 106 to the heat sink 102. The relative thermal conductivity of the two described paths may be affected by the thermal conductivity of interfaces and materials within the paths. For example, thermally conductive shell 104 may be connected to thermally conductive layer 110 of attached electrical cord 116 by a thermally robust process such as crimping or soldering or through the use of a TIM. In contrast, in certain applications, thermally conductive housing 120, receptacle 106 and heat sink 102 may be attached to each other less effective thermal interfaces such as a dry surface contact. In particular embodiments, thermally conductive housing 120 may be constructed from a material having relatively low thermal conductivity such as rolled steel.

Receptacle 106 may include electrical connectors designed to mate with electrical connectors of heat producing electronic module 118, which may be useful for conducting electrical signals between heat producing electronic module 118 and other electrical equipment located within chassis 122. In certain embodiments, chassis 122 may be, for example, a server or electronic system that includes a plurality of receptacles 106 configured to receive a plurality of thermally conductive housings 120. Thermally conductive housings 120 may include CXP or other optoelectronic modules used to interface signals transmitted over optical fibers to the server or electronic system. CXP or other optoelectronic modules may electrically connect, for example, to a circuit board within the server or electronic system.

In embodiments, chassis 122 may include one or more fans operable to flow cooling air over externally plugged heat-producing electronic module 118 and attached cord(s) 116, which may be useful in dissipating heat from the thermally conductive layer 110 of the electrical cord 116. Chassis 122 may also include vents or ports configured to direct the cooling airflow over attached cord(s) 116.

Figure 2:
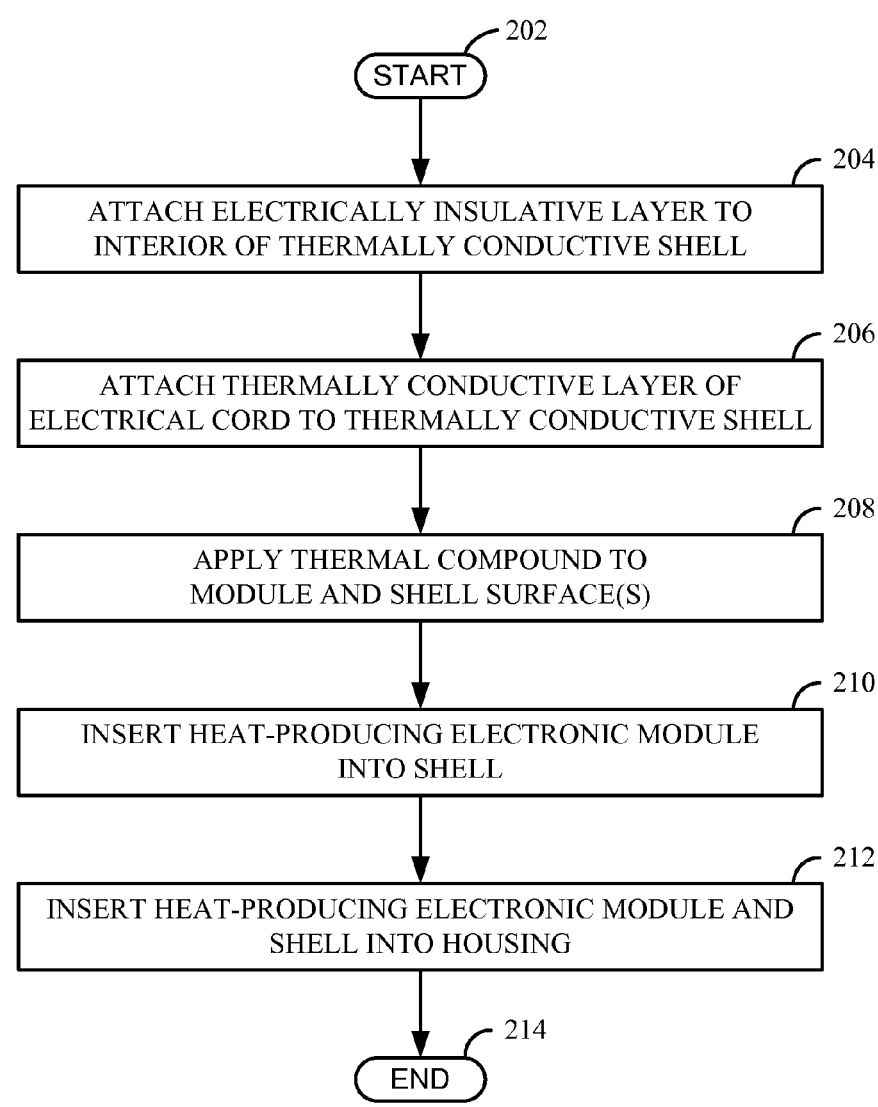
FIG. 2 is a flow diagram of a method of assembling an apparatus for cooling an externally pluggable heat-producing electronic module, according to embodiments consistent with FIG. 1.

FIG. 2 is a flow diagram 200 illustrating a method for assembling a cooling apparatus useful for dissipating heat from an externally pluggable heat-producing electronic module (118, FIG. 1). The cooling apparatus may establish a thermally conductive path between the heat-producing electronic module (118, FIG. 1) and a thermally conductive electrical cord (116, FIG. 1) attached to the module (118, FIG. 1), according to embodiments consistent with FIG. 1. The method for assembling a cooling apparatus 200 may be useful for creating a cooling apparatus to efficiently transfer heat away from a heat-producing electronic module. The process 200 moves from start 202 to operation 204.

Operation 204 generally refers to attaching an electrically insulative layer to at least one interior surface of a thermally conductive shell, which may correspond to the view provided by 325 (FIG. 3) and its associated description. Attachment of an electrically insulative layer may be useful in protecting a heat-producing electronic module from ESD or other electrical events. Once the electrically insulative layer is attached, the process moves to operation 206.

Operation 206 generally refers to attaching a thermally conductive layer of a first electrical cord to the thermally conductive shell, which may correspond to the view provided by 350 (FIG. 3) and its associated description. Attaching a thermally conductive layer of an electrical cord to the thermally conductive shell may be useful for creating a thermal path from the shell to the cord. In certain embodiments, a thermally conductive layer of a second electrical cord may be attached to the thermally conductive shell. Once the thermally conductive layer of an electrical cord is attached to the thermally conductive shell, the process moves to operation 208.

Operation 208 generally refers to applying a thermally conductive compound to at least one outer surface of the heat-producing electronic module and/or to at least one interior surface of the thermally conductive shell, which may correspond to the view provided by 350 (FIG. 3) and its associated description. A thermally conductive compound can be used to enhance thermal conductivity between two mating surfaces (e.g., of the heat-producing electronic module and the conductive shell) by filling in irregularities on the surfaces. Once the thermally conductive compound is applied, the process moves to operation 210.

Operation 210 generally refers to inserting the heat-producing electronic module into the thermally conductive shell to form a thermally conductive interface between at least one outer surface of the heat-producing electronic module and at least one interior surface of the thermally conductive shell, which may correspond to the view provided by 375 (FIG. 3) and its associated description. Inserting the heat-producing electronic module into the shell may also include attaching the module to conductors within electrical cord 116. Once the heat-producing electronic module inserted into the thermally conductive shell, the process moves to operation 212.

Operation 212 generally refers to inserting the heat-producing electronic module and the thermally conductive shell into a thermally conductive housing, which may correspond to the view provided by 375 (FIG. 3) and its associated description. Inserting the heat-producing electronic module and the thermally conductive shell into a thermally conductive housing may provide a thermal path from the thermally conductive shell, through the thermally conductive housing, to a heat sink mounted on a housing receptacle within a chassis. This thermally conductive path may be useful in dissipating a portion of heat generated by the heat-producing electronic module 118 (FIG. 1). The thermally conductive housing may be inserted into a mating receptacle within a chassis of an electronic system to establish electrical connections to the heat-producing electronic module. Once the heat-producing electronic module and the thermally conductive shell are inserted into a thermally conductive housing, the process 200 may end at block 214.

FIG. 3 includes four cross-sectional views 300, 325, 350 and 375 depicting a method for assembling an apparatus configured to cool a heat-producing electronic module 118, according to embodiments consistent with FIGS. 1 and 2. The four views 300, 325, 350 and 375 may be useful in illustrating details involved in creating a cooling apparatus assembly that has a highly conductive thermal path between a heat-producing electronic module 118 and a thermally conductive layer 110 of an attached electrical cord 116. The views may be useful in illustrating steps used in creating a cooling apparatus configured to dissipate heat generated by the heat-producing electronic module 118.

View 300 depicts a thermally conductive shell 104, designed to at least partially enclose a heat-producing electronic module 118, and maintain thermally conductive contact between the heat-producing electronic module 118 and at least one interior surface of the thermally conductive shell 104. In certain embodiments, the thermally conductive shell 104 may be designed to have a plurality of surfaces in thermally conductive contact with heat-producing electronic module 118, and to fit within the interior of an existing thermally conductive housing 120. In certain embodiments, thermally conductive shell 104 may be designed to enclose outer surface areas of heat-producing electronic module 118 having particularly high heat densities.

View 325 depicts the results of attaching a first electrically insulative layer 130 to at least one interior surface of the thermally conductive shell 104. A first electrically insulative layer 130 such as mica, or an electrically insulative thermal interface material (TIM) may be attached to interior surfaces of the thermally conductive shell 104 to protect the heat-producing electronic module 118 from exposure to electrostatic discharge (ESD) or other electrical events. Heat-producing electronic module 118 may be, for example, an optoelectronic module which may be sensitive to ESD events. ESD or other electrical events may be introduced to the thermally conductive shell 104, for example, through an electrical connection of the shell 104 to an attached electrical cord 116.

Electrically insulative layer 130 may be attached to thermally conductive shell 104 by the use of a commercially available adhesive or self-adhesive layer. Electrically insulative layer 130 may be chosen to have a high thermal conductivity in order to facilitate the transfer of heat from heat-producing electronic module 118 to thermally conductive shell 104. The thickness of electrically insulative layer 130 may be chosen, in conjunction with the interior dimensions of thermally conductive shell 104, in order to accommodate the insertion of heat-producing electronic module 118 within the thermally conductive shell 104.

View 350 depicts the results of attaching a thermally conductive layer 110 of an electrical cord 116 to the thermally conductive shell 104. Creating a thermally conductive attachment between shell 104 and thermally conductive layer 110 of electrical cord 116 may be useful in creating a path for conducting heat away from heat-producing electronic module 118 into electrical cord 116, where it may be dissipated.

In certain embodiments, attaching layer 110 to shell 104 may include a soldering process, and in certain embodiments, attaching layer 110 to shell 104 may involve a crimping process. In certain embodiments, attaching layer 110 to shell 104 may involve application of an adhesive TIM to bond the thermally conductive layer 110 to the thermally conductive shell 104.

Thermally conductive and dissipative cord 116 may be created by forming a second electrically insulative layer 112 on an outer surface of at least one electrical conductor (124A, 124B, FIG. 1), attaching a thermally conductive layer 110 to an outer surface of the second electrically insulative layer 112, and forming a third electrically insulative layer 108 on an outer surface of the thermally conductive layer 110.

View 375 depicts the results of inserting the heat-producing electronic module 118 into the thermally conductive shell 104 to form a thermally conductive interface between at least one outer surface of the module 118 and at least one interior surface of the thermally conductive shell 104. A thermally conductive interface created between the module 118 and the thermally conductive shell 104 may be useful in providing a path for conducting heat generated by the module 118 to the thermally conductive layer 110 of electrical cord 116.

In certain embodiments, a layer of thermally conductive compound (e.g., thermal grease or TIM) may be applied to either an outer surface of the heat-producing electronic module 118 and/or an interior surface of the thermally conductive shell 104 before inserting the module 118 into the shell 104. A thermally conductive compound may include materials such as a Shin-Etsu thermal grease, Bergquist gap pad, or an Indium TIM product. A thermally conductive compound may be useful to enhance thermal conductivity of a thermal interface between the module 118 and the shell 104.

According to certain embodiments, view 375 may also depict the results of inserting the heat-producing electronic module 118 and the thermally conductive shell 104 into a thermally conductive housing 120. Housing 120 may be useful for mating the module 118 with a chassis and providing a supplemental thermal path for the dissipation of heat produced by module 118. In certain embodiments, the heat-producing electronic module 118 and the thermally conductive shell 104 may be inserted into the thermally conductive housing 120 through the use of a press-fit technique. In certain embodiments, the heat-producing electronic module may be held within the thermally conductive shell through the use of fasteners such as screws or clips.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for assembling a cooling apparatus for dissipating heat from a heat-producing electronic module, the method comprising:

attaching an electrically insulative layer to at least one interior surface of a thermally conductive shell;

attaching a thermally conductive layer of a thermally conductive electrical cord to the thermally conductive shell; and inserting, to form a thermally conductive interface between an outer surface of the heat-producing electronic module and an interior surface of the thermally conductive shell, the heat-producing electronic module into the thermally conductive shell, the heat-producing electronic module being an optoelectronic module.

2. The method of claim 1, further comprising inserting the heat-producing electronic module and the thermally conductive shell into a thermally conductive housing.

3. The method of claim 1, wherein attaching the thermally conductive layer of the thermally conductive electrical cord to the thermally conductive shell includes a soldering process.

4. The method of claim 1, wherein attaching the thermally conductive layer of the thermally conductive electrical cord to the thermally conductive shell includes a crimping process.

5. The method of claim 1, wherein attaching the thermally conductive layer of the thermally conductive electrical cord to the thermally conductive shell includes application of an adhesive thermal interface material (TIM).

6. The method of claim 1, further comprising applying a thermally conductive compound to at least one surface of a group of surfaces consisting of: an outer surface of the heat-producing electronic module and an interior surface of the thermally conductive shell, in conjunction with inserting the heat-producing electronic module into the thermally conductive shell.

7. The method of claim 1, wherein the optoelectronic module is a 100Gb/s form factor pluggable (CXP) module.

\* \* \* \* \*